(12) United States Patent
Kono et al.

(10) Patent No.: US 12,185,637 B2
(45) Date of Patent: Dec. 31, 2024

(54) VIBRATION GENERATION DEVICE

(71) Applicant: Faurecia Clarion Electronics Co., Ltd., Saitama (JP)

(72) Inventors: Kenji Kono, Saitama (JP); Akira Mutou, Saitama (JP)

(73) Assignee: Faurecia Clarion Electronics Co., Ltd., Saitama (JP)

( * ) Notice: Subject to any disclaimer, the term of this patent is extended or adjusted under 35 U.S.C. 154(b) by 843 days.

(21) Appl. No.: 17/414,504

(22) PCT Filed: Sep. 6, 2019

(86) PCT No.: PCT/JP2019/035232
§ 371 (c)(1),
(2) Date: Jun. 16, 2021

(87) PCT Pub. No.: WO2020/137015
PCT Pub. Date: Jul. 2, 2020

(65) Prior Publication Data
US 2022/0069192 A1 Mar. 3, 2022

(30) Foreign Application Priority Data

Dec. 28, 2018 (JP) .................................. 2018-247239

(51) Int. Cl.
*H01L 41/053* (2006.01)
*B60J 5/04* (2006.01)
(Continued)

(52) U.S. Cl.
CPC ............ *H10N 30/88* (2023.02); *B60J 5/0493* (2013.01); *B60Q 9/00* (2013.01); *H10N 30/20* (2023.02)

(58) Field of Classification Search
CPC ....... H10N 30/88; H10N 30/20; B06B 1/0603
(Continued)

(56) References Cited

U.S. PATENT DOCUMENTS 9,743,166 B2    8/2017  Abe et al.
2010/0284555 A1  11/2010  Suzuki et al.
(Continued)

FOREIGN PATENT DOCUMENTS

DE    102008056774 A1   6/2009
EP    3051839 A1        8/2016
(Continued)

OTHER PUBLICATIONS

International Search Report of PCT/JP2019/035232 mailed on Oct. 29, 2019.
(Continued)

*Primary Examiner* — Derek J Rosenau
(74) *Attorney, Agent, or Firm* — IP Business Solutions, LLC

(57) ABSTRACT

Exposure to sunlight is minimized.
A vibration generation device 1 includes a vibration generator that generates a vibration, and a vibration transmission member 4 that has a vehicle-side fixed part 30 to be fixed to a vehicle 50 and transmits to the vehicle 50 the vibration generated by the vibration generator, wherein the vehicle-side fixed part 30 is provided within a range R of the vibration generator, as viewed from the vibration direction of the vibration generator.

9 Claims, 12 Drawing Sheets

(51) Int. Cl.
*B60Q 9/00* (2006.01)
*H10N 30/20* (2023.01)
*H10N 30/88* (2023.01)

(58) Field of Classification Search
USPC .................................. 310/322, 334, 348
See application file for complete search history.

(56) References Cited

U.S. PATENT DOCUMENTS

| | | | | |
|---|---|---|---|---|
| 2013/0298419 | A1* | 11/2013 | Trevett | B08B 3/12 34/279 |
| 2016/0249120 | A1* | 8/2016 | Abe | H04R 7/045 |
| 2016/0301292 | A1 | 10/2016 | Shinohe | |

FOREIGN PATENT DOCUMENTS

| | | |
|---|---|---|
| EP | 3 321 127 A1 | 5/2018 |
| JP | 61142654 U | 9/1986 |
| JP | H04-126485 U | 11/1992 |
| JP | 4601410 B2 | 12/2010 |
| JP | 2011-020651 A | 2/2011 |
| JP | 2014-075617 A | 4/2014 |
| JP | 2016-198727 A | 12/2016 |
| WO | 2012102223 A1 | 8/2012 |

OTHER PUBLICATIONS

Written Opinion of the International Searching Authority of PCT/JP2019/035232 mailed on Oct. 29, 2019.
European Office Action issued on Jan. 17, 2024 in corresponding European patent application No. 19 905 584.9-1001.
Extended European Search Report issued on Aug. 17, 2022 in corresponding European patent application No. 19905584.9-1001/ 3904160 PCT/JP2019035232.
International Preliminary Report on Patentability of PCT Application No. PCT/JP2019/035232 mailed on Jul. 8, 2021.
Written Opinion of the International Searching Authority of PCT Application No. PCT/JP2019/035232 mailed on Oct. 29, 2019.

* cited by examiner

VIBRATION GENERATION DEVICE

TECHNICAL FIELD

The present invention relates to a vibration generation device.

BACKGROUND ART

A technique for generating a sound by vibrating a windshield of a vehicle is disclosed in Patent Literature 1. Patent Literature 1 discloses "a piezoelectric vibrator is installed on a windshield of an automobile (for example, a truck, in particular, a cab-over truck), an electric signal supply device is provided which applies an electric signal to the piezoelectric vibrator, and the electric signal supply device has a function of applying the electric signal to the piezoelectric vibrator when an alarm signal for the driver is output from an alarm system (an alarm system for the driver, various known alarm systems)."

CITATION LIST

Patent Literature

Patent Literature 1: Japanese Patent Laid-Open No. 2011-20651

SUMMARY OF INVENTION

Technical Problem

Patent Literature 1 has a problem in that the piezoelectric vibrator provided to the windshield is exposed to sunlight and thus easily deteriorates due to ultraviolet rays.

An object of the present invention is to provide a vibration generation device capable of minimizing exposure to sunlight.

Solution to Problem

All contents of Japanese Patent Application No. 2018-247239 filed on Dec. 28, 2018 are incorporated herein.

According to an aspect of the present invention, provided is a vibration generation device including a vibration generator that generates a vibration, and a vibration transmission member that has a vehicle-side fixed part to be fixed to a vehicle and transmits to the vehicle the vibration generated by the vibration generator, wherein the vehicle-side fixed part is provided within a range of the vibration generator, as viewed from a vibration direction of the vibration generator.

In the vibration generation device according to an aspect of the present invention, the vibration transmission member has an extension part extending in a direction of being spaced apart from the vehicle-side fixed part, and having a tip serving as a free end, the vehicle-side fixed part is to be fixed to a window glass covering an opening portion of the vehicle or to a frame supporting the window glass, and the vibration generator is fixed to the tip of the extension part.

In the vibration generation device according to an aspect of the present invention, the vehicle-side fixed part is located on a line passing through a center of gravity of the vibration generator and extending in the vibration direction of the vibration generator.

In the vibration generation device according to an aspect of the present invention, in a case where the vehicle-side fixed part is fixed to the window glass or the frame, the vibration generator is disposed such that the vibration direction is oriented in a horizontal direction.

In the vibration generation device according to an aspect of the present invention, the extension part has high thermal conductivity for conducting heat generation of the vibration generator.

In the vibration generation device according to an aspect of the present invention, the extension part has a plate shape, and in a case where the vehicle-side fixed part is fixed to the window glass or the frame, a plate surface of the extension part is horizontal.

In the vibration generation device according to an aspect of the present invention, the vehicle-side fixed part is longer than at least a width of the extension part, in a width direction of the vehicle.

In the vibration generation device according to an aspect of the present invention, the vibration generator includes a vibration member that generates an air vibration in association with the vibration, and allows the air vibration generated by the vibration member to enter a window glass of the vehicle.

In the vibration generation device according to an aspect of the present invention, the vibration transmission member disposes the vibration generator at a position such that the vibration member faces the window glass.

The vibration generation device according to an aspect of the present invention includes a reflection member that reflects the air vibration generated by the vibration member toward the window glass.

In the vibration generation device according to an aspect of the present invention, the vibration generator is fixed to one end portion of the vehicle-side fixed part.

In the vibration generation device according to an aspect of the present invention, the vibration member generates an air vibration in a high frequency range.

Advantageous Effect of Invention

According to the aspect of the present invention, exposure to sunlight is minimized.

BRIEF DESCRIPTION OF DRAWINGS

FIGS. 1A to 1D are four-side views each illustrating a configuration of a vibration generation device according to a first embodiment of the present invention, in which FIG. 1A is a front view, FIG. 1B is a top view, FIG. 1C is a side view, and FIG. 1D is a bottom view.

FIGS. 4A to 4B are views each illustrating a configuration of a vehicle with the vibration generation device attached thereto, in which FIG. 4A is an external view and FIG. 4B is a cross-sectional view taken along A-A illustrated in FIG. 4A.

DESCRIPTION OF EMBODIMENTS

Hereinafter, embodiments of the present invention will be described with reference to the drawings.

First Embodiment

Figure 1:
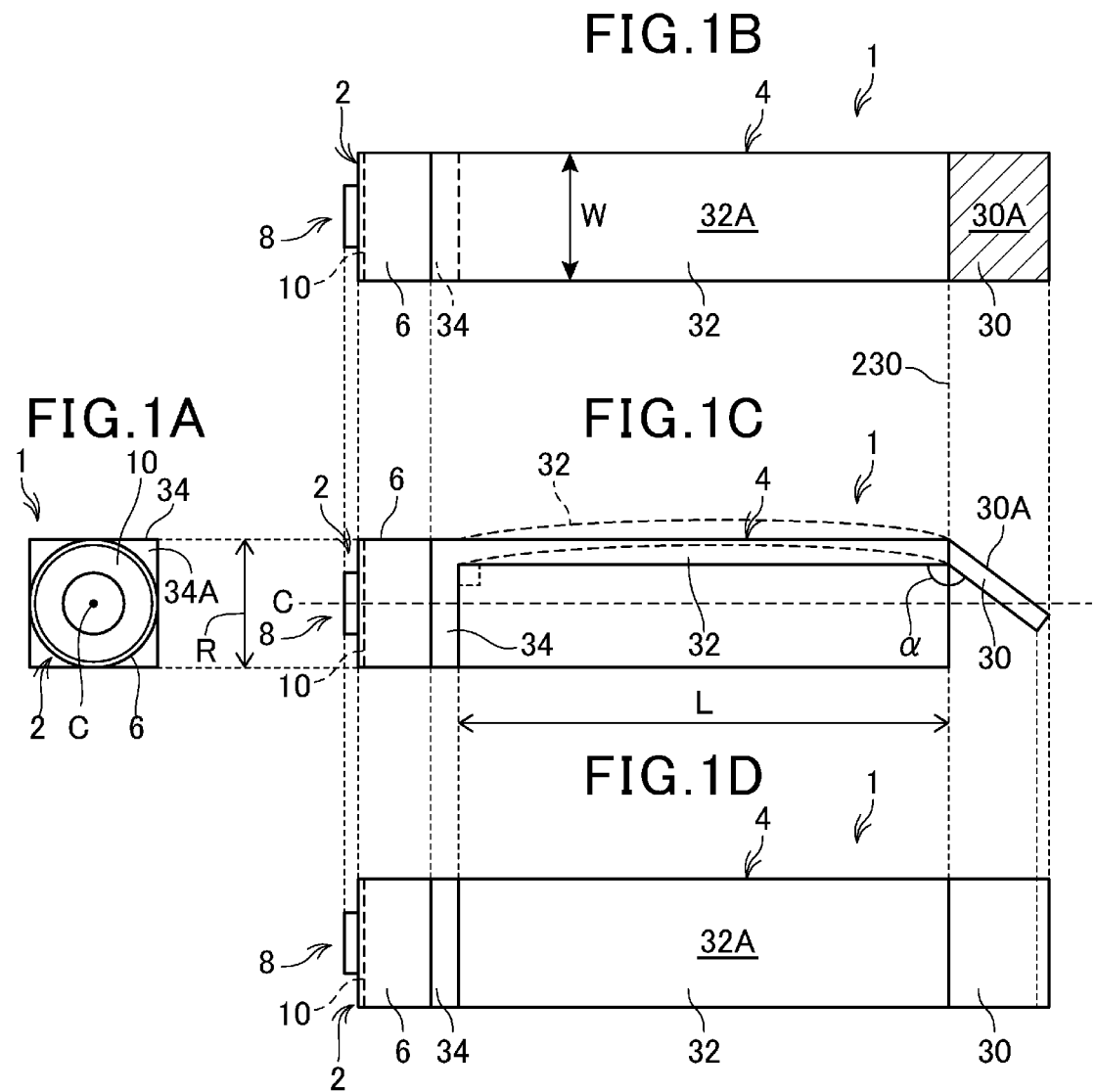

FIGS. 1A to 1D are four-side views each illustrating a configuration of a vibration generation device 1 according to the present embodiment, in which FIG. 1A is a front view, FIG. 1B is a top view, FIG. 1C is a side view, and FIG. 1D is a bottom view.

The vibration generation device 1 includes an exciter 2 serving as a vibration generation member that generates a vibration, and a vibration transmission member 4 that transmits the vibration generated by this exciter 2.

Figure 2:
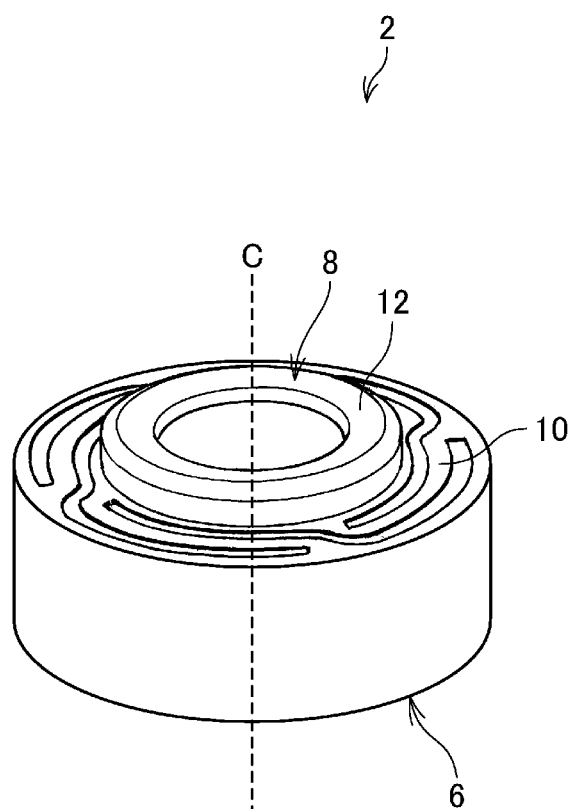
FIG. 2 is a perspective view illustrating a configuration of an exciter.
Figure 3:
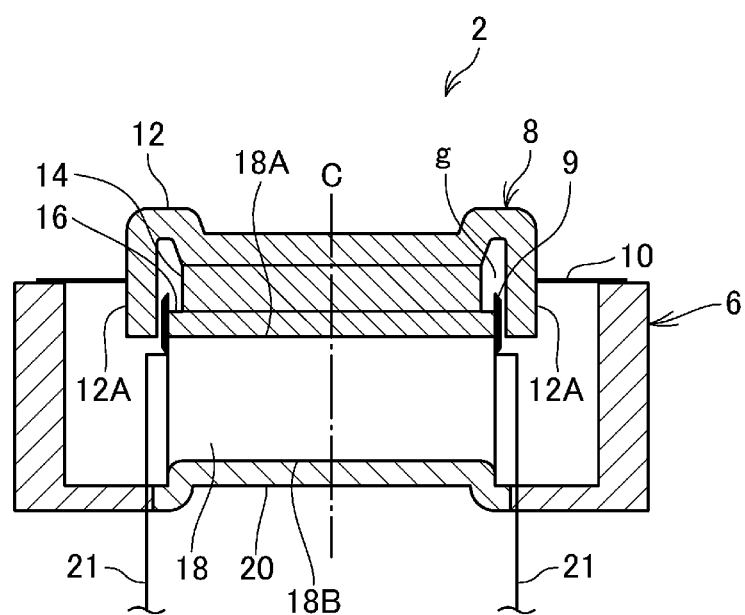
FIG. 3 is a cross-sectional view of the exciter.

FIG. 2 is a perspective view illustrating a configuration of the exciter 2, and FIG. 3 is a cross-sectional view of the exciter 2.

The exciter 2 is a device that receives an audio electric signal from a sound generator 59 (FIG. 5) and that generates a vibration based on the audio electric signal.

More specifically, as illustrated in FIGS. 2 and 3, the exciter 2 includes a tubular frame 6 having a central axis C, a magnetic circuit 8, a damper 10 that suspends the magnetic circuit 8 on the frame 6, and a voice coil 9 (FIG. 3) housed in the frame 6. In this exciter 2, when the audio electric signal is input to the voice coil 9, a Lorentz force acts between the voice coil 9 and the magnetic circuit 8, thereby vibrating the magnetic circuit 8 suspended on the damper 10.

The frame 6 is cylindrically formed of a resin material advantageous for weight reduction or a metal material advantageous for heat dissipation.

As illustrated in FIG. 3, the magnetic circuit 8 has a yoke 12, a disc-shaped magnet 14, and a plate 16, and these are all formed in a substantially circular shape in a plan view and stacked in this order from the outside of the frame 6 along the central axis C. The yoke 12 has a side wall 12A extending along the central axis C, and the disc-shaped magnet 14 and the plate 16 are located on the inside of this side wall 12A so as to be spaced apart from the side wall 12A. This spacing forms a magnetic gap g.

This magnetic circuit 8 is, as described above, suspended coaxially with the central axis C of the frame 6 by the damper 10. The damper 10 is a thin plate-shaped member made of metal, such as stainless steel, and is provided around the magnetic circuit 8 as illustrated in FIG. 2.

A voice coil bobbin 18 has a cylindrical shape having a diameter such that one end portion 18A thereof enters the magnetic gap g of the magnetic circuit 8, and is housed below the magnetic circuit 8 in the frame 6 coaxially with the central axis C. This one end portion 18A is wound with the voice coil 9 to which the audio electric signal is applied, and the voice coil 9 is disposed in the magnetic gap g. On the other hand, the other end portion 18B of the voice coil bobbin 18 is fixed to a plate portion 20 that closes an opening of the frame 6.

A signal line 21 is connected to the voice coil 9, and the audio electric signal is input from the signal line 21. In association with the input of the audio electric signal, a Lorentz force acts on the voice coil bobbin 18 and the magnetic circuit 8 in the direction of the central axis C of the frame 6, and the magnetic circuit 8 in a state of being suspended by the damper 10 vibrates in the direction of the central axis C of the frame 6.

In the exciter 2, the magnetic circuit 8, the voice coil bobbin 18, and the frame 6 have a rotating body shape, and each of them is assembled coaxially with the central axis C of the frame 6. Thus, a center of gravity G of the exciter 2 is located substantially above the central axis C or in the vicinity of the central axis C.

The vibration transmission member 4 is a member having a function of fixing the exciter 2 to a member serving as a vibration plate of a vehicle 50 (FIG. 4), a function of disposing the exciter 2 at a position spaced apart from the member serving as the vibration plate, and a function of transmitting the vibration of the exciter 2 to the member serving as the vibration plate.

Specifically, as illustrated in FIG. 1A to 1D, the vibration transmission member 4 includes a vehicle-side fixed part 30 to be fixed to the member of the vehicle 50; an extension part 32 horizontally extending in a linear shape in the direction of being spaced apart from this vehicle-side fixed part 30, and having a tip serving as a free end; and a vibration generator fixing part 34 which is provided at the tip serving as the free end of this extension part 32, and to which the exciter 2 is fixed. By this vibration transmission member 4, the exciter 2 is disposed at the position spaced apart from the member of the vehicle so as to be supported in a cantilever manner.

This vibration transmission member 4 is formed by bending a rectangular metal plate of aluminum or the like. Specifically, as illustrated in FIG. 1C, one end side of the rectangular metal plate is bent at a predetermined inclination angle α to form the vehicle-side fixed part 30, and the other end side of the rectangular metal plate is bent at 90 degrees to form the vibration generator fixing part 34.

As illustrated in FIG. 1B, the vehicle-side fixed part 30 has a planar fixed surface 30A on an upper surface thereof, and the fixed surface 30A is firmly secured to the vehicle by an adhesive, or a pressure-sensitive adhesive, such as a double-sided tape.

Furthermore, similarly to the vehicle-side fixed part 30, the vibration generator fixing part 34 also has a planar fixed surface 34A on an upper surface thereof as illustrated in FIG. 1A, and the exciter 2 is fixed to the fixed surface 34A. Any fixing method, such as an adhesive, a double-sided tape, or a screw, can be used for fixing the exciter 2.

As illustrated in FIGS. 1B and 1C, the extension part 32 is a plate-shaped part having a substantially rectangular shape in a plan view, with a predetermined width W and a predetermined length L. The extension part 32 has high thermal conductivity for transferring heat generation of the exciter 2 in the direction of the length L and is formed of a metal material (aluminum in the present embodiment) having flexibility enough to deform in a vertical direction D (FIG. 5) in association with the vibration of the exciter 2.

The inclination angle α of the vehicle-side fixed part 30 with respect to the extension part 32 is an angle for allowing the extension part 32 to extend horizontally (in the direction perpendicular to the vertical direction) when the vehicle-side fixed part 30 is fixed to the member of the vehicle. At this time, the extension part 32 extends in a posture such that a plate surface 32A is substantially parallel to a horizontal surface, and easily deforms in the vertical direction D at an appropriate amount of deformation as indicated by the dotted line in FIG. 1C.

Furthermore, the extension part 32 is substantially rectangular shape in a plan view, so that a vibration of a sound corresponding to a high frequency range can also be emitted from the extension part 32. Furthermore, heat generation of the exciter 2 transferred to the extension part 32 can also be sufficiently dissipated from the entire surface of the extension part 32, and the cooling performance of the exciter 2 can be enhanced.

Here, the exciter 2 is fixed in a posture such that the vibration direction, that is, the central axis C of the frame 6 is perpendicular to the fixed surface 34A of the vibration generator fixing part 34. This fixed surface 34A is formed by bending an end portion of the extension part 32 at 90 degrees, so that the central axis C of the exciter 2 is substantially parallel to the extension part 32 as illustrated in FIG. 1C. At the time of attachment to the vehicle, the extension part 32 is maintained horizontally, so that the exciter 2 is also fixed in a state where the vibration direction is oriented horizontally. Thus, if the vehicle 50 sways in the vertical direction D during traveling or the like, the vibration direction of the magnetic circuit 8 of the exciter 2 is orthogonal to this sway, so that a situation can be prevented where the magnetic circuit 8 is greatly swayed by this sway and the damper 10 suspending the magnetic circuit 8 breaks.

Furthermore, even if sway of the vehicle 50 in the vertical direction D contains a frequency component that resonates with the vibration of the exciter 2, vibration amplification of the exciter 2 due to this sway is also minimized.

In the vibration transmission member 4, as illustrated in FIG. 1C, the vehicle-side fixed part 30 and the vibration generator fixing part 34 are both bent to the same side with respect to the extension part 32 (the lower side in the illustrated example) and thereby face each other. In particular, in the present embodiment, the vehicle-side fixed part 30 is configured to be located on a line of the central axis C of the exciter 2 fixed to the vibration generator fixing part 34. As described above, the center of gravity G of the exciter 2 is present on the line of the central axis C, so that the vehicle-side fixed part 30 serving as a fixed end is located on an extension line of the vibration direction passing through the center of gravity G of the exciter 2 (the direction of the central axis C).

This configuration can suppress a situation where, when the exciter 2 fixed to the free end emits a vibration, the exciter 2 greatly sways due to its own vibration. To obtain the effect of suppressing such sway of the exciter 2, the vehicle-side fixed part 30 may not be on the extension line of the vibration direction passing through the center of gravity G of the exciter 2 as long as the vehicle-side fixed part 30 is disposed in the vicinity of the extension line.

Furthermore, as illustrated in FIG. 1C, in the vibration generation device 1, the vehicle-side fixed part 30 is disposed within a range R of the exciter 2 as the exciter 2 is viewed from the vibration direction (the direction of the central axis C). This configuration minimizes displacement (spacing distance) between the exciter 2 and the vehicle-side fixed part 30 in the vertical direction D, so that the vibration of the exciter 2 in the horizontal direction is easily accurately transferred to the vehicle-side fixed part 30, and thus the sound reproducibility can be enhanced.

Next, a vehicle attachment structure of the vibration generation device 1 will be described.

Figure 4A:
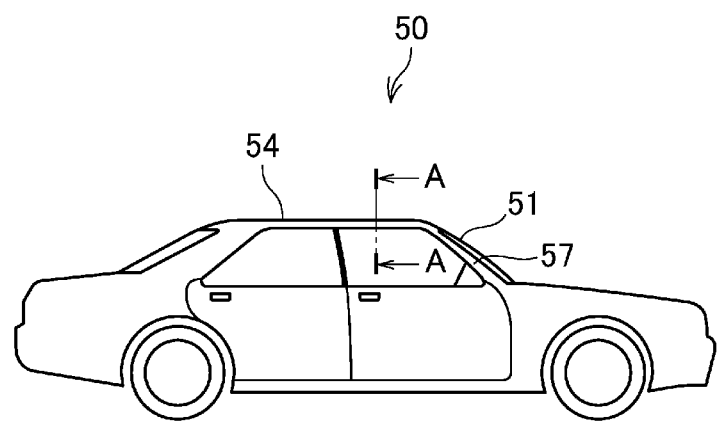
Figure 4B:
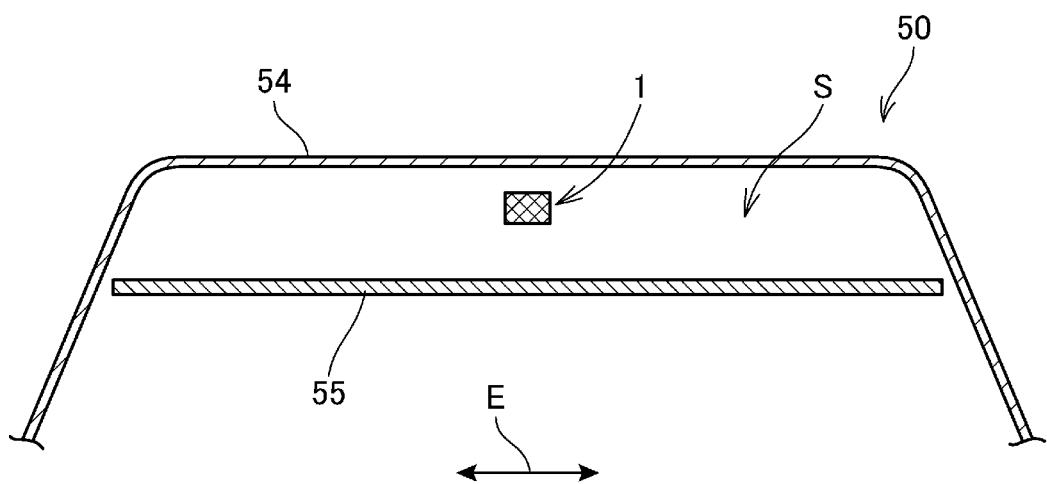

FIGS. 4A to 4B are views each illustrating a configuration of the vehicle 50 with the vibration generation device 1 attached thereto, in which FIG. 4A is an external view and FIG. 4B is a cross-sectional view taken along A-A illustrated in FIG. 4A.

While the vehicle 50 typically has a roof panel (also called an outer panel) 54 as a member that can be the vibration plate, the vibration generation device 1 of the present embodiment vibrates, as the vibration plate, a window glass covering an opening portion formed in the vehicle 50 and generates a sound in a vehicle cabin.

Specifically, the vibration generation device 1 of the present embodiment vibrates, as the vibration plate, a windshield 51 serving as one of window glasses attached to the vehicle 50 such that they cannot be opened and closed. As illustrated in FIG. 4B, this vibration generation device 1 is installed in a space (hereinafter referred to as a ceiling interior material back-side space) S between the roof panel 54 forming a roof of the vehicle 50 and a ceiling interior material 55 of the vehicle 50, and at substantially the center of the vehicle width of the vehicle 50. The vibration generation device 1 is installed at substantially the center of the vehicle width, so that, as compared with a case where the vibration generation device 1 is installed near either the left or right side, a vibration of the windshield 51 can be less likely to be affected by a pillar 57 (a so-called A-pillar) supporting both left and right sides and can be produced particularly in a low frequency range.

Figure 5:
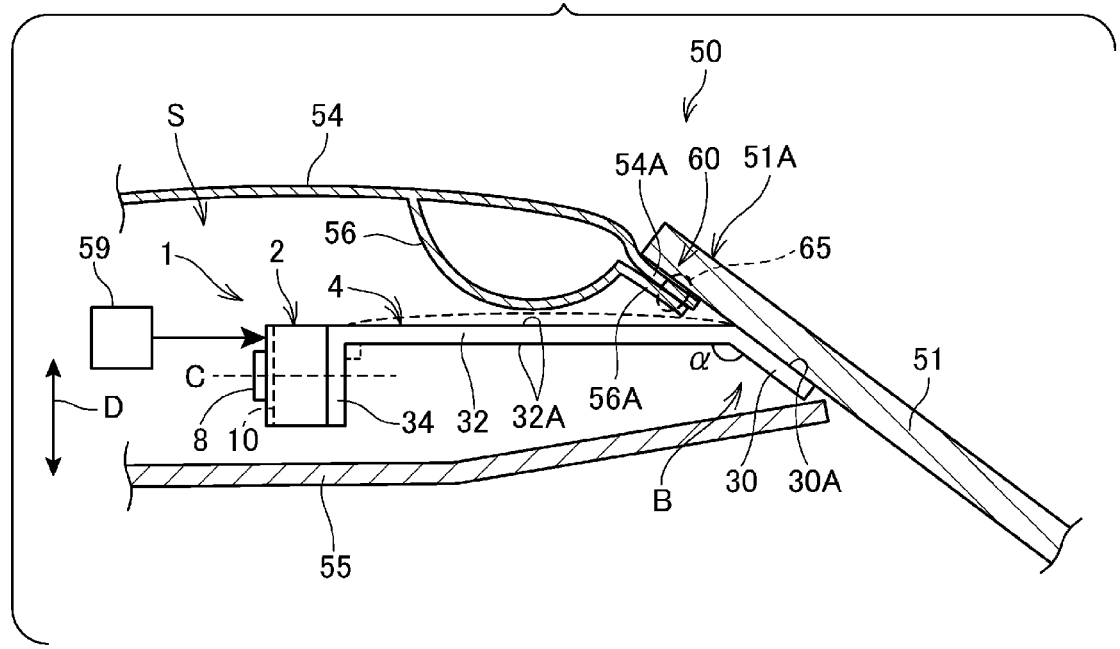
FIG. 5 is a view schematically illustrating an internal configuration of a front side of a ceiling interior material back-side space.

FIG. 5 is a view schematically illustrating an internal configuration of a front side of the ceiling interior material back-side space S.

As illustrated in the same figure, in the ceiling interior material back-side space S, an upper end portion 51A of the windshield 51 is joined to a tip portion 54A of the roof panel 54 by adhesion or the like. Furthermore, a tip portion 56A of a reinforcement 56 that reinforces strength of the roof panel 54 is superimposed on and fixed to the tip portion 54A of the roof panel 54. The tip portion 54A of the roof panel 54 and the tip portion 56A of the reinforcement 56 form a frame 65 for fixing the upper end portion 51A of the windshield 51.

The vehicle-side fixed part 30 of the vibration generation device 1 is fixed to a glass surface of the windshield 51 exposed between this frame 65 and the ceiling interior material 55, by an adhesive, a pressure-sensitive adhesive, or the like, and the exciter 2 is supported on the extension part 32 in a cantilever manner at a position spaced apart from the vehicle-side fixed part 30 toward the vehicle rear side (that is, the back side of the ceiling interior material back-side space S).

In this configuration, the exciter 2 is disposed at a position spaced apart from the windshield 51, so that, as compared with a configuration in which the exciter 2 is directly fixed to the windshield 51, it becomes difficult to receive sunlight, minimizing the exposure to sunlight. Furthermore, even in a case where a space B sufficient for fixing the exciter 2 to the windshield 51 is not provided between the frame 65 and the ceiling interior material 55, the vibration generation device 1 can be installed as long as the space B enough to allow the vehicle-side fixed part 30 to be fixed is secured. Furthermore, the vibration generation device 1 is disposed in the ceiling interior material back-side space S, so that, even in a case where the vibration generation device 1 is fixed to the windshield 51, the vibration generation device 1 neither obstructs nor enters the occupant's view.

As described above, in the vibration generation device 1, the fixed surface 30A of the vehicle-side fixed part 30 is inclined at the inclination angle α, so that the extension part 32 extends in the horizontal direction, and the exciter 2 is disposed so as to be supported in a cantilever manner in a posture such that the vibration direction (central axis C) is oriented in the horizontal direction.

Thus, even in a case where a vibration with a large acceleration is input from the exciter 2, the extension part 32 deforms appropriately, so that, while an impact sound that causes a sense of discomfort due to sway is dispersed by the deformation and thereby transmission of the impact sound to the windshield 51 is suppressed, the vibration emitted by the exciter 2 can be sufficiently transferred to the windshield 51. Furthermore, the vibration direction of the magnetic circuit 8 of the exciter 2 is orthogonal to the vertical direction, so that a situation is avoided where sway of the vehicle 50 in the vertical direction D strengthens the vibration of the magnetic circuit 8 and thereby the damper 10 is damaged.

The above-described embodiment provides the following effects.

In the vibration generation device 1 of the present embodiment, the vehicle-side fixed part 30 is provided within the range R of the exciter 2, as viewed from the vibration direction of the exciter 2 (the direction of the central axis C).

This minimizes displacement (spacing distance) between the exciter 2 and the vehicle-side fixed part 30 in the vertical direction D, so that the vibration of the exciter 2 in the horizontal direction is easily accurately transferred to the vehicle-side fixed part 30, and the sound reproducibility can be enhanced.

Furthermore, the exciter 2 is not required to be directly fixed to the windshield 51, so that it becomes difficult for the exciter 2 to receive sunlight, minimizing the exposure of the exciter 2 to sunlight.

The vibration generation device 1 of the present embodiment includes the vibration transmission member 4 that transmits the vibration of the exciter 2, and has the vehicle-side fixed part 30 to be fixed to the windshield 51 of the vehicle 50, and the extension part 32 extending in the direction of being spaced apart from this vehicle-side fixed part 30, and having the tip serving as the free end, and the exciter 2 is fixed to the tip of this extension part 32.

According to this configuration, the exciter 2 is disposed at the position spaced apart from the windshield 51 by the extension part 32, so that it becomes more difficult for the exciter 2 to receive sunlight.

Furthermore, the exciter 2 is disposed so as to be spaced apart from the windshield 51, so that it can be made difficult to interfere with the occupant's view in the windshield 51.

In the vibration generation device 1 of the present embodiment, the vehicle-side fixed part 30 is located on the line passing through the center of gravity G of the exciter 2 and extending in the vibration direction (the direction of the central axis C).

This can suppress a situation where the exciter 2 fixed to the free end of the extension part 32 greatly sways due to the vibration emitted by itself.

In the vibration generation device 1 of the present embodiment, in a case where the vehicle-side fixed part 30 is fixed to the windshield 51, the exciter 2 is disposed such that its own vibration direction (the direction of the central axis C) is oriented in the horizontal direction.

According to this configuration, if the vehicle 50 sways in the vertical direction D during traveling or the like, the vibration direction of the exciter 2 is orthogonal to this sway, so that a situation can be prevented where the exciter 2 is greatly swayed by this sway and thereby the damper 10 is damaged.

Furthermore, even if sway of the vehicle 50 in the vertical direction D contains a frequency component that resonates with the vibration of the exciter 2, vibration amplification of the exciter 2 due to this sway is also minimized.

In the vibration generation device 1 of the present embodiment, the extension part 32 has flexibility enough to deform in association with the vibration of the exciter 2. Thus, while an impact sound that causes a sense of discomfort due to sway is dispersed by the deformation and thereby transmission of the impact sound to the windshield 51 is suppressed, the vibration emitted by the exciter 2 can be sufficiently transferred to the windshield 51.

In the vibration generation device 1 of the present embodiment, the extension part 32 is formed of a material having high thermal conductivity for conducting heat generation of the exciter 2, so that heat of the exciter 2 can be effectively dissipated from the entire area of the full length of the extension part 32.

In the vibration generation device 1 of the present embodiment, the extension part 32 has a plate shape, and in a case where the vehicle-side fixed part 30 is fixed to the windshield 51, the plate surface 32A is disposed horizontally. This allows the above-described deformation to occur appropriately according to sway of the vehicle 50 in the vertical direction D. Furthermore, the extension part 32 has a plate shape, so that the heat dissipation area is increased and the cooling performance of the exciter 2 is thus enhanced, and furthermore, a vibration sound in a high frequency band of the exciter 2 (that is, a sound in a high frequency range) can also be produced from the plate surface 32A.

Modification of First Embodiment

Figure 6:
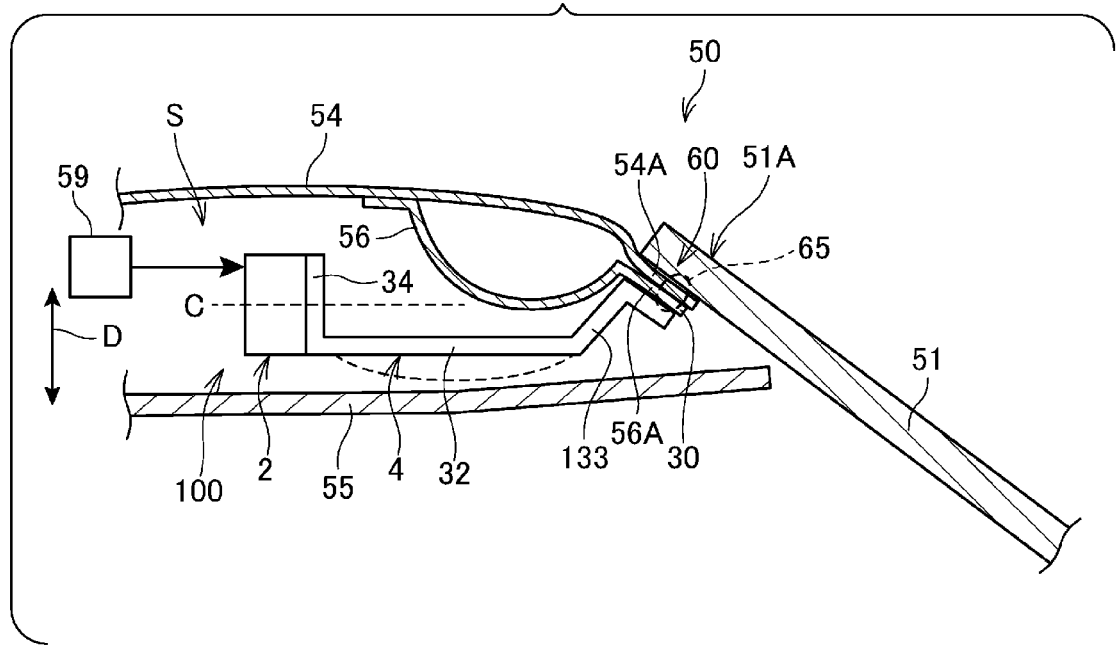
FIG. 6 is a view schematically illustrating a configuration of a vibration generation device according to a modification of the present invention, together with an attachment structure to the vehicle.

Although in the first embodiment, the configuration in which the vibration generation device 1 is fixed to the windshield 51 has been exemplified, not limited to this, the vehicle-side fixed part 30 may be fixed to the frame 65 supporting the windshield 51, as illustrated in FIG. 6.

According to this configuration, the vibration of the exciter 2 is also transferred to the roof panel 54 (a panel member included in the vehicle 50) through the frame 65, and the roof panel 54 can also vibrate as the vibration plate.

Furthermore, as illustrated in FIG. 6, there may be provided a vibration generation device 100 in which a suitable coupling part 133 is integrally provided between the extension part 32 and the vehicle-side fixed part 30 for the purpose of, for example, avoiding a member of the vehicle 50 (the reinforcement 56 in the illustrated example).

Figure 7:
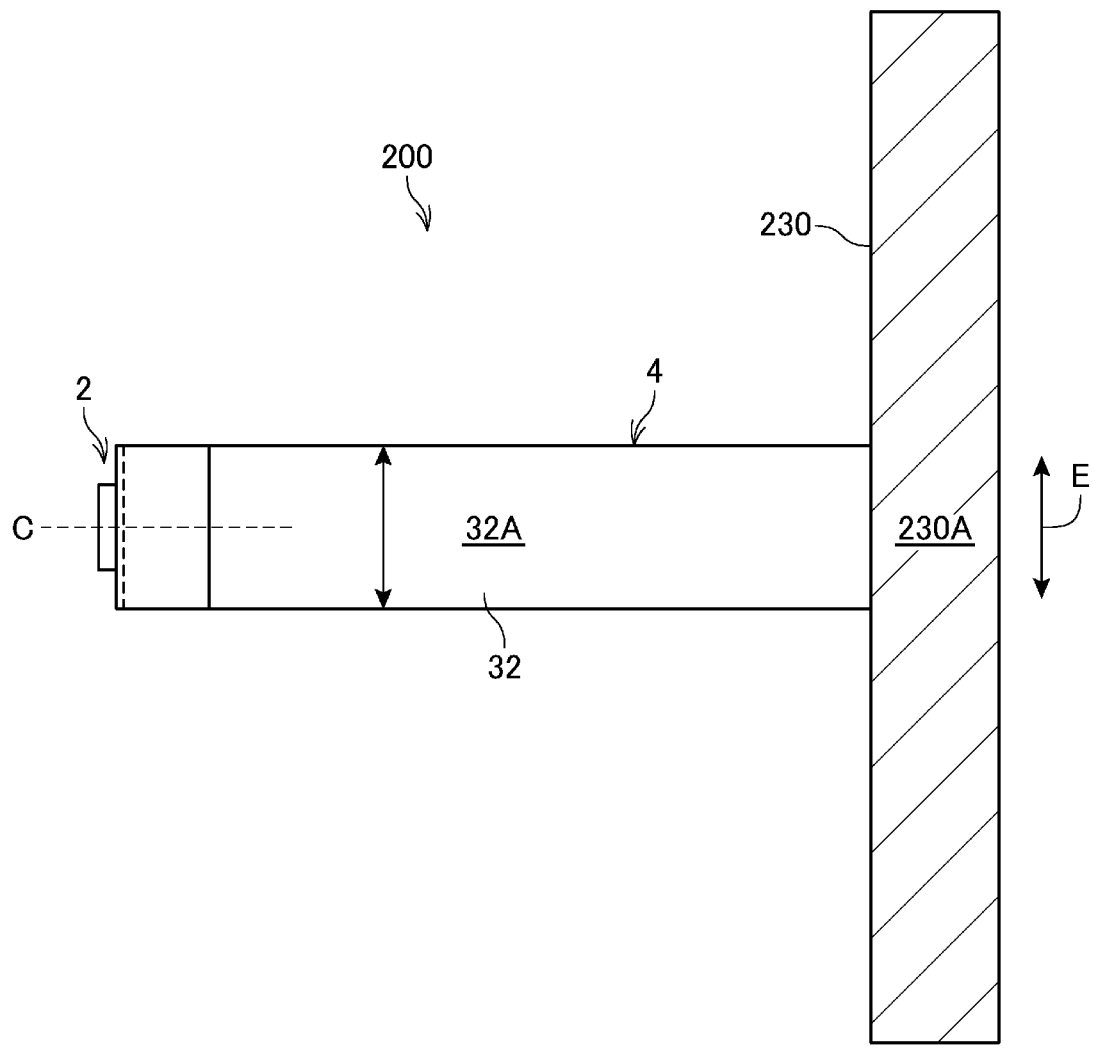
FIG. 7 is a view illustrating a configuration of a vibration generation device according to another modification of the present invention.

Furthermore, as illustrated in FIG. 7, there may be provided a vibration generation device 200 in which a fixed surface 230A of a vehicle-side fixed part 230 is extended in a vehicle width direction E so as to be longer than at least the width W of the extension part 32. This configuration enlarges the area of the fixed surface 230A, so that the vibration generation device 200 can be more firmly fixed to the windshield 51 or the frame 65, and a vibration can be further transferred to the windshield 51 or the frame 65.

Furthermore, each of the vibration generation devices 1, 100, and 200 may be fixed to a lower end portion of the windshield 51 or to a frame supporting the lower end portion. In this case, each of the vibration generation devices 1, 100, and 200 is preferably disposed below an instrument panel.

Furthermore, each of the vibration generation devices 1, 100, and 200 can be fixed to, not limited to the windshield 51, any window glass that closes the opening portion of the vehicle 50, such as a rear window glass, or to a frame supporting the window glass. The window glass or the frame is vibrated as the vibration plate by each of these vibration generation devices 1, 100, and 200, so that a sound can be emitted in the vehicle cabin.

Second Embodiment

Next, a second embodiment of the present invention will be described.

Figure 8:
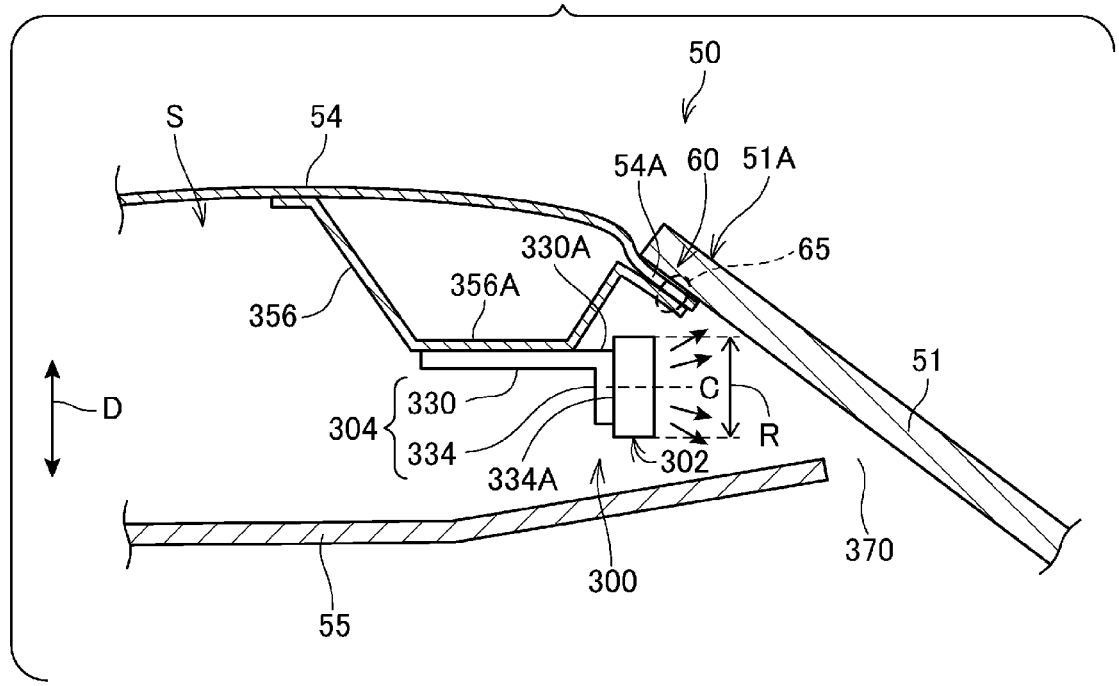
FIG. 8 is a view schematically illustrating an installation state of a vibration generation device according to a second embodiment of the present invention.

FIG. 8 is a view schematically illustrating an installation state of a vibration generation device 300 according to the present embodiment.

As illustrated in the same figure, similarly to the vibration generation device 1 of the first embodiment, the vibration generation device 300 is disposed in the ceiling interior material back-side space S of the vehicle 50 and includes an exciter 302 serving as a vibration generation member that generates a vibration, and a vibration transmission member 304 that transmits to the vehicle 50 the vibration generated by this exciter 302.

The vibration transmission member 304 has a function of fixing the exciter 302 to a member serving as a vibration plate of the vehicle 50, and a function of transmitting the vibration of the exciter 302 to the member serving as the vibration plate, and specifically includes a vehicle-side fixed part 330 to be fixed to a reinforcement 356 of the vehicle 50, and a vibration generator fixing part 334 to which the exciter 302 is fixed. Similarly to the extension part 32, the vehicle-side fixed part 330 is a rectangular plate member extending in a linear shape, and one end portion 330A of the vehicle-side fixed part 330 is bent in an L shape at substantially 90 degrees to form the vibration generator fixing part 334. That is, also in the vibration generation device 300 of the present embodiment, the vehicle-side fixed part 330 is provided within the range R of the exciter 302, as viewed from the vibration direction of the exciter 302 (the direction of the central axis C), enhancing the sound reproducibility.

In this vibration transmission member 304, substantially the entire range of the full length of the vehicle-side fixed part 330 is fixed to a horizontal surface portion 356A horizontal in the reinforcement 356, so that a fixed surface 334A of the vibration generator fixing part 334 is disposed in parallel to the vertical direction D. The exciter 302 is fixed to the fixed surface 334A, so that the vibration direction of the exciter 302 (central axis C) is aligned with the horizontal direction.

The exciter 302 vibrates based on an audio electric signal input from the sound generator 59 (FIG. 5), and the vibration is transmitted to the windshield 51 via the frame 65 including the reinforcement 356. Thus, the windshield 51 functions as a so-called vibration plate of a speaker, emitting a sound in the vehicle cabin.

In particular, the vibration generator fixing part 334 is directly provided to the one end portion 330A of the vehicle-side fixed part 330 without intervention of the extension part 32 included in the vibration generation device 1 of the first embodiment, and a large portion of the vehicle-side fixed part 330 is fixed to the reinforcement 356, so that a vibration component in a low frequency range of the exciter 302 is accurately transferred to the reinforcement 356, and a sound with a high reproducibility in the low frequency range can be emitted from the windshield 51.

Here, in the present embodiment, the vibration generator fixing part 334 is disposed at a position closer to the windshield 51 side than the vehicle-side fixed part 330, so that the exciter 302 fixed to the fixed surface 334A is disposed in a state of facing (opposing) the windshield 51.

Furthermore, in the vehicle 50 of the present embodiment, a through portion 370 is provided between the ceiling interior material 55 and the windshield 51. This through portion 370 is formed by a gap, one opening, or a plurality of openings (for example, a grid) which is provided between the ceiling interior material 55 and the windshield 51 in the vehicle width direction.

With such a configuration, when an air vibration occurs due to the vibration of the exciter 302, the air vibration enters the windshield 51, is reflected by the windshield 51, is introduced into the vehicle cabin through the through portion 370 and then spreads.

Thus, in addition to a sound in association with the vibration transmission of the vibration transmission member 304, a sound in association with the air vibration also spreads in the vehicle cabin, so that the acoustic effect in the vehicle cabin is further enhanced.

Figure 9:
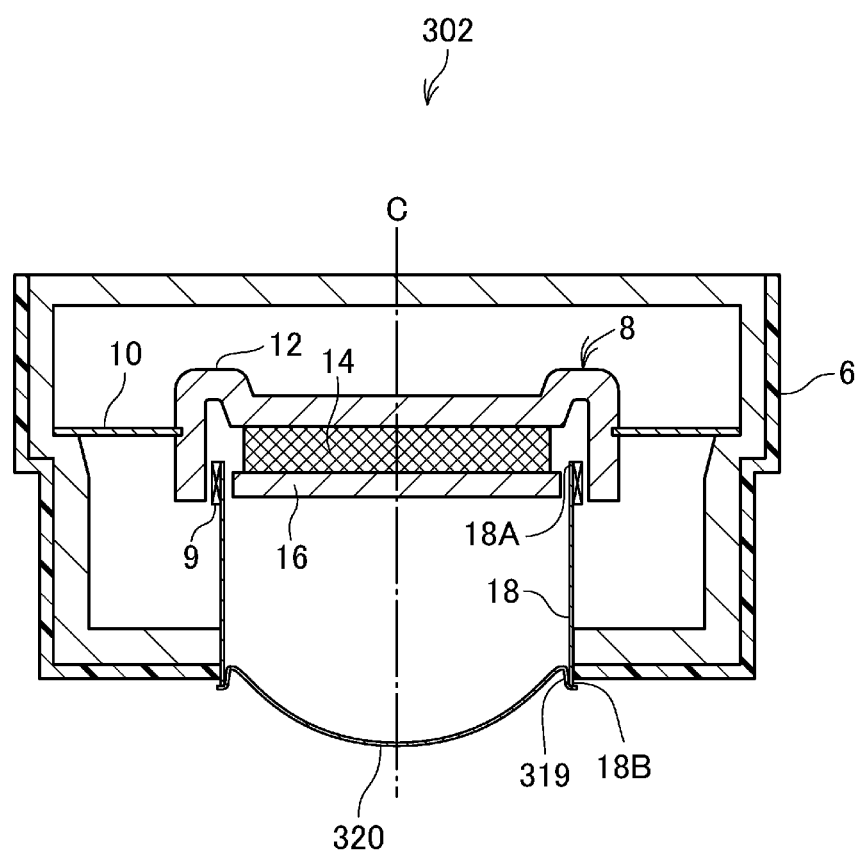
FIG. 9 is a cross-sectional view illustrating a configuration of an exciter included in the vibration generation device according to the second embodiment.

FIG. 9 is a cross-sectional view illustrating a configuration of the exciter 302.

As illustrated in the same figure, in the exciter 302 of the present embodiment, the distance from the one end portion 18A of the voice coil bobbin 18 to the other end portion 18B is longer than that of the exciter 2 illustrated in FIG. 3, an outer peripheral surface of this other end portion 18B is attached to a peripheral edge portion of an opening portion 319 formed in the frame 6, and a vibration member 320 is provided so as to cover an open portion of this other end portion 18B. The vibration member 320 is formed of silk, aluminum, or the like which has a dome shape, and vibrates in the direction of the central axis C together with the voice coil bobbin 18, so that an air vibration is effectively output from the vibration member 320. This vibration member 320 uses silk or aluminum, which is also employed in a dome portion of a speaker dedicated to a high range, and thus an air vibration corresponding to a fine sound in a high frequency range is output.

The fine air vibration in the high frequency range emitted by the exciter 302 is introduced into the vehicle cabin through the through portion 370 as described above. That is, a sound in the high frequency range introduced from the through portion 370 and a sound emitted from the windshield 51 and having a high reproducibility in the low frequency range spread in the vehicle cabin, achieving an extremely high acoustic effect.

The present embodiment provides the following effects in addition to the same effects as those of the first embodiment.

In the vibration generation device 300 of the present embodiment, the exciter 302 is disposed by the vibration transmission member 304 so as to face the windshield 51, and thus the exciter 302 is not required to be directly fixed to the windshield 51, so that it becomes difficult for the exciter 302 to receive sunlight, minimizing the exposure of the exciter 302 to sunlight.

In addition, in the present embodiment, the exciter 302 includes the vibration member 320 that generates an air vibration in association with the vibration, and allows the air vibration generated by this vibration member 320 to enter the windshield 51 of the vehicle 50. Thus, the acoustic effect is further enhanced by, in addition to a sound in association with the vibration transmission of the vibration transmission member 304, a sound in association with the air vibration.

In the present embodiment, the vibration transmission member 304 disposes the exciter 302 at a position such that the vibration member 320 faces the windshield 51. This allows an air vibration to directly enter the windshield 51, minimizing attenuation of the air vibration.

In the present embodiment, the exciter 302 is fixed to the one end portion 330A of the vehicle-side fixed part 330, so that, as compared with a case where the extension part 32 is provided, the vibration of the exciter 302 (in particular, a vibration component in the low frequency range) is accurately transferred to the vehicle 50, enhancing the sound reproducibility.

In the present embodiment, the vibration member 320 generates an air vibration in the high frequency range. Thus, an extremely high acoustic effect is achieved by a mixture of a sound with a high reproducibility in the low frequency range in association with the vibration transmission of the vibration transmission member 304 and a sound in the high frequency range in association with the air vibration.

Modification of Second Embodiment

In the second embodiment, the exciter 302 is disposed so as to face the windshield 51 but is not limited to this.

Figure 10:
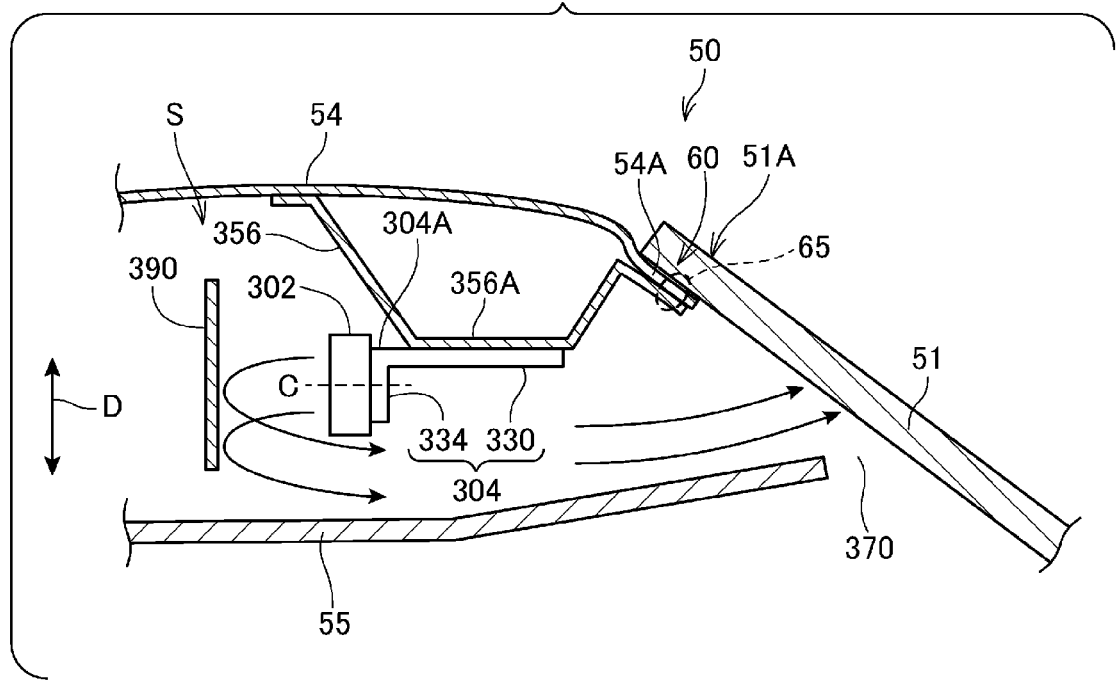
FIG. 10 is a schematic view illustrating a configuration according to a modification of the second embodiment.

For example, as illustrated in FIG. 10, the vibration transmission member 304 may dispose the exciter 302 at a position farther from the windshield 51 than the vehicle-side fixed part 330, and a reflection member 390 that reflects an air vibration generated by the exciter 302 toward the windshield 51 may be provided in front of the exciter 302.

Thus, the exciter 302 is disposed at a position back from the windshield 51, so that the exposure to sunlight is further minimized.

Figure 11:
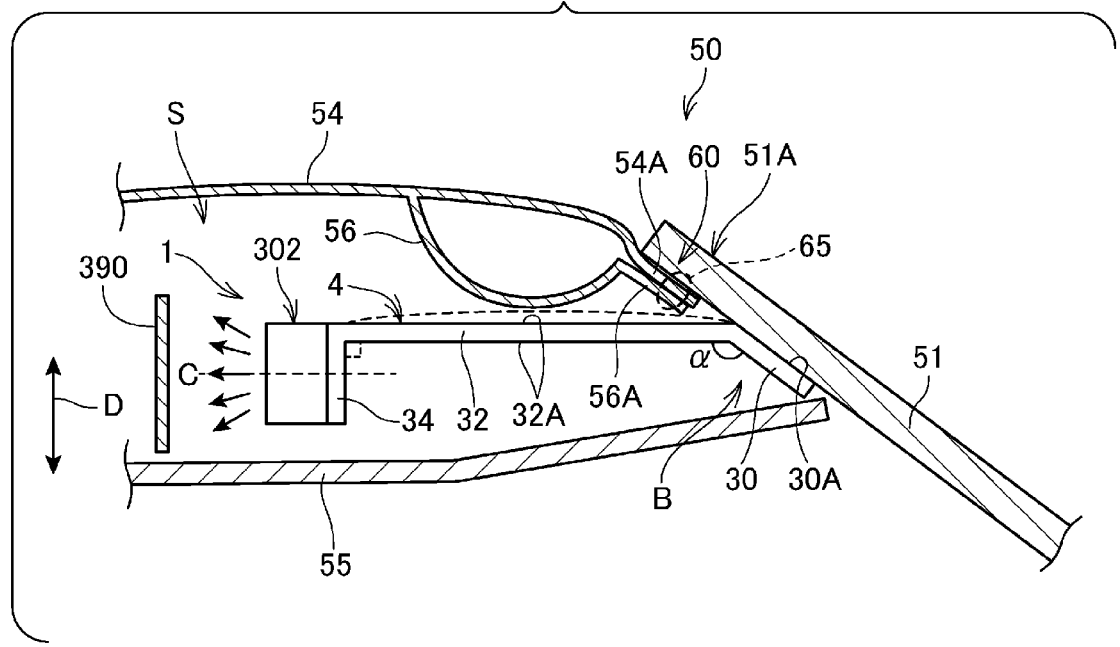
FIG. 11 is a schematic view illustrating a configuration according to a modification of the second embodiment.
Figure 12:
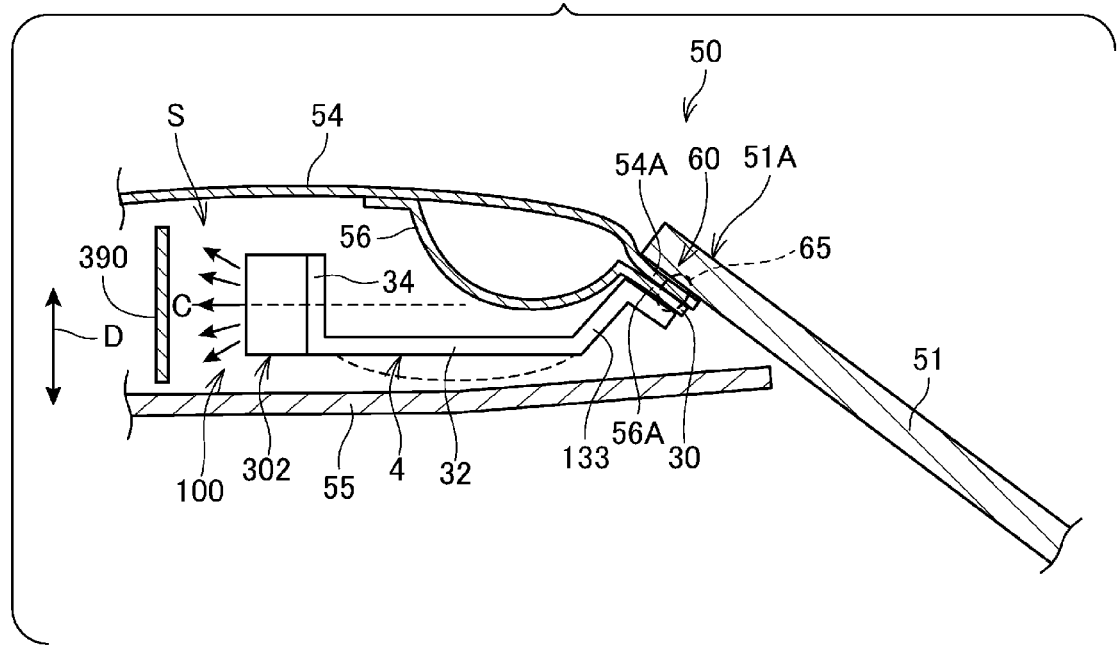
FIG. 12 is a schematic view illustrating a configuration according to a modification of the second embodiment.

In this case, as illustrated in FIGS. 11 and 12, each of the vibration generation device 1 of the first embodiment and the vibration generation device 100 according to the modification of the first embodiment may include, instead of the exciter 2, the exciter 302 that generates an air vibration in the high frequency range, and the reflection member 390 may be provided in front of the exciter 302.

Although the reflection member 390 is, in the ceiling interior material back-side space S, installed at, for example, the roof panel 54 of the vehicle 50, the installation aspect of the reflection member 390 in the vehicle 50 is any one that is capable of reflecting the air vibration of the exciter 302.

For example, the vehicle-side fixed part 330 of the vibration generation device 300 may extend from the vibration generator fixing part 334 in a substantially T shape, in a side view of the exciter 302.

The first and second embodiments merely exemplify an aspect of the present invention, and any modifications and applications are possible without departing from the gist of the present invention.

For example, directions such as horizontal, perpendicular, parallel, and vertical directions, various kinds of numeral values, and shapes herein do not intentionally exclude ranges surrounding these directions and these numeral values, and approximate shapes, unless otherwise mentioned, and include ranges surrounding them and approximate shapes (so-called equivalents) as long as the same operations and effects are provided and the numeral values do not depart from the critical significance. That is, for example, directions such as horizontal, perpendicular, parallel, and vertical directions may be substantially horizontal, substantially perpendicular, substantially parallel, and substantially vertical directions, respectively.

REFERENCE SIGNS LIST 1, 100, 200, 300 vibration generation device
2, 302 exciter (vibration generator)
4, 304 vibration transmission member
6 frame
8 magnetic circuit
9 voice coil
10 damper
18 voice coil bobbin
30, 230, 330 vehicle-side fixed part
30A, 230A fixed surface
32 extension part
32A plate surface
34, 334 vibration generator fixing part
34A, 334A fixed surface
50 vehicle
51 windshield (window glass)
54 roof panel
55 ceiling interior material
65 frame
320 vibration member
C central axis (vibration direction)
D vertical direction
E vehicle width direction
G center of gravity
S ceiling interior material back-side space
α inclination angle

The invention claimed is:

1. A vibration generation device comprising:
a vibration generator configured to generate a vibration, the vibration generator including an exciter in which each of a magnetic circuit, a voice coil bobbin, and a frame have a rotating body shape, and each of the magnetic circuit, the voice coil bobbin, and the frame is assembled coaxially with a central axis of the frame; and
a vibration transmission member having a vehicle-side fixed part to be fixed to a glass surface of a windshield of a vehicle or to a frame for fixing the upper end portion of the windshield when in use, the vibration transmission member being configured to transmit to the vehicle the vibration generated by the vibration generator,
wherein the vehicle-side fixed part is provided within a range of the vibration generator, as viewed from a vibration direction of the vibration generator,
the vibration transmission member includes the vehicle-side fixed part that is installed at a center of the vehicle width of the vehicle when in use; an extension part horizontally extending in a linear shape in a direction of being spaced apart from the vehicle-side fixed part toward a vehicle rear side when the extension part is fixed to the vehicle, and having a tip serving as a free end; and a vibration generator fixing part which is provided at the tip serving as the free end of the extension part, and to which the exciter is fixed, wherein
when the exciter is fixed to the vehicle, the exciter is fixed in a posture such that the vibration direction, that is, the central axis of the frame is perpendicular to a fixed surface of the vibration generator fixing part, the fixed surface is formed by bending an end portion of the extension part at 90 degrees, so that the central axis of the exciter is parallel to the extension part, and the exciter is supported on the extension part in a cantilever manner at a position spaced apart from the vehicle-side fixed part toward the vehicle rear side in a state where the vibration direction is oriented horizontally.

2. The vibration generation device according to claim 1, wherein when the vehicle-side fixed part is fixed to the vehicle,
the vehicle-side fixed part is to be fixed to a window glass covering an opening portion of the vehicle or to a frame supporting the window glass.

3. The vibration generation device according to claim 2, wherein the vehicle-side fixed part is located on a line passing through a center of gravity of the vibration generator and extending in the vibration direction of the vibration generator.

4. The vibration generation device according to claim 2, wherein the extension part has thermal conductivity for conducting heat generation of the vibration generator.

5. The vibration generation device according to claim 2, wherein the extension part has a plate shape, and in a case where the vehicle-side fixed part is fixed, when in use, to the windshield or the frame, a plate surface of the extension part is horizontal.

6. The vibration generation device according to claim 2, wherein the vehicle-side fixed part is longer than at least a width of the extension part, when in use, in a width direction of the vehicle.

7. The vibration generation device according to claim 1, wherein the vibration generator includes a vibration member configured to generate an air vibration in association with the vibration, and allows the air vibration generated by the vibration member to enter the windshield when in use.

8. The vibration generation device according to claim 7, wherein the vibration transmission member disposes the vibration generator at a position such that the vibration member faces the windshield when in use.

9. The vibration generation device according to claim 7, comprising a reflection member configured to reflect the air vibration generated by the vibration member toward the windshield when in use.

* * * * *